United States Patent
Sasano et al.

(10) Patent No.: US 8,133,817 B2
(45) Date of Patent: Mar. 13, 2012

(54) SHALLOW TRENCH ISOLATION ETCH PROCESS

(75) Inventors: Hiroki Sasano, Sunnyvale, CA (US);
Meihua Shen, Fremont, CA (US);
Radhika Mani, San Jose, CA (US);
Sunil Srinivasan, Milpitas, CA (US);
Daehee Weon, Cupertino, CA (US);
Nicolas Gani, San Jose, CA (US);
Shashank Deshmukh, San Ramon, CA (US); Anisul Khan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 577 days.

(21) Appl. No.: 12/325,220

(22) Filed: Nov. 30, 2008

(65) Prior Publication Data
US 2009/0170333 A1 Jul. 2, 2009

Related U.S. Application Data

(60) Provisional application No. 60/991,006, filed on Nov. 29, 2007.

(51) Int. Cl.
*H01L 21/302* (2006.01)

(52) U.S. Cl. .......................... 438/714; 438/717; 438/738

(58) Field of Classification Search ................. 438/424, 438/431, 700, 706, 709, 711, 712, 714, 717, 438/723, 735, 738
See application file for complete search history.

(56) References Cited

U.S. PATENT DOCUMENTS

| | | | | |
|---|---|---|---|---|
| 6,225,187 B1 * | 5/2001 | Huang et al. | ................... | 438/424 |
| 6,287,974 B1 * | 9/2001 | Miller | ........................... | 438/706 |
| 6,458,691 B1 * | 10/2002 | Subramanian et al. | ....... | 438/638 |
| 6,583,063 B1 * | 6/2003 | Khan et al. | ..................... | 438/706 |
| 6,635,185 B2 * | 10/2003 | Demmin et al. | ................. | 216/64 |
| 6,727,150 B2 * | 4/2004 | Tang | ............................. | 438/296 |
| 2002/0160615 A1 * | 10/2002 | Kawada et al. | ............... | 438/700 |
| 2008/0160720 A1 * | 7/2008 | Ryu et al. | ....................... | 438/433 |

* cited by examiner

*Primary Examiner* — Lan Vinh
(74) *Attorney, Agent, or Firm* — Moser Taboada; Alan Taboada

(57) ABSTRACT

Methods for fabricating one or more shallow trench isolation (STI) structures are provided herein. In some embodiments, a method for fabricating one or more shallow trench isolation (STI) structures may include providing a substrate having a patterned mask layer disposed thereon to define one or more STI structures. The substrate may be etched using a plasma formed from a process gas mixture to form one or more STI structures on the substrate, wherein the process gas mixture comprises a fluorine-containing gas and either a fluorocarbon-containing gas or a hydrofluorocarbon-containing gas.

23 Claims, 4 Drawing Sheets

SHALLOW TRENCH ISOLATION ETCH PROCESS

CROSS REFERENCE TO RELATED APPLICATIONS

This application claims benefit of U.S. provisional application Ser. No. 60/991,006, filed Nov. 29, 2007, which is herein incorporated by reference.

BACKGROUND

1. Field

Embodiments of the present invention generally relate to shallow trench isolation structures and methods for fabrication thereof.

2. Description of the Related Art

One challenge of fabricating, or etching, shallow trench isolation (STI) features in a substrate is microloading between regions of dense features and regions of isolated features. As illustratively shown in FIG. 4A, microloading manifests itself as differences in feature profile and etch depth between regions of high feature density 404 and regions of low feature density 406 on a substrate 402 in which the features are being etched. For example, regions of low feature density 406 may etched to a depth A that is different (greater, in the example of FIG. 4A) than an etch depth B corresponding to the regions of high feature density 404. Controlling microloading is important, as certain applications (such as NAND flash) require high microloading, while other applications (such as DRAM) require low to minimal microloading.

In addition, as line widths continue to shrink, the ion energies necessary to etch the dense features to a comparable etch depth and profile as compared to isolated features needs to be increased. However, an increase in bias power supplied to the substrate to increase the ion energy leads to other complications. For example, topography related asymmetric profile and floating gate polysilicon attack in the dense regions are some unintended consequences of using processes with high bias power. FIG. 4B depicts an illustrative example of an asymmetric feature profile where a sidewall 408 of a feature 410 being etched into the substrate 402 is not symmetrically disposed with respect to an opposing sidewall 412 of the feature 410. This problem may occur while providing a similar mask critical dimension (CD), as shown in FIG. 4B, or with a varying mask CD, as shown in FIG. 4C.

In another example, conventional STI etching chemistries, such as mixtures of hydrogen bromide, chlorine, and oxygen, typically require high ion energies (e.g., obtained from high bias power) to etch silicon. However, these high bias power processes often undesirably result in various defects, such as pinching off at high aspect ratios, poor microloading, and asymmetric feature profiles, particularly in regions of high feature density. FIG. 4D illustratively depicts an example of pinching off on a substrate 402 where a bottom 414 of the feature 410 being etched into the substrate 402 closes, or is pinched off, by inwardly sloping sidewalls 416 of the feature 410.

Moreover, other difficulties also exist. For example, achieving a good feature profile without any bowing or asymmetry in the STI structure or achieving very low etch depth range (good etch depth uniformity) is also difficult for certain conventional etch chemistries. Another problem encountered is the incompatibility of certain materials with conventional etch chemistries. For example, carbon-based masks used to define the STI are incompatible with the use of chlorine or oxygen as major gas species due to mask loss resulting from the attack of the mask material by these gases.

As such, conventional STI etch chemistries and processes suffer from deficiencies such as etch depth microloading, profile pinching off, asymmetric profiles (or profile distortion) related to pattern density and/or aspect ratio differences in the substrate being etched.

Thus, there is a need for fabricating STI structures defining high aspect ratio STI profiles that may provide at least one of reduced distortion, improved control over etch depth microloading, or mask integrity.

SUMMARY

Embodiments of the present invention provide shallow trench isolation (STI) structures and methods of fabrication thereof. In some embodiments, the STI structures may be etched utilizing a process gas mixture comprising a fluorine-containing gas and a fluorocarbon- or hydrofluorocarbon-containing gas. Optionally, at least one of hydrogen bromide (HBr), chlorine ($Cl_2$), or oxygen ($O_2$) may be provided. Optionally, at least one dilutent gas may be provided, such as any inert gas, nitrogen ($N_2$), helium (He), Argon (Ar), or the like.

Balancing of the chemistry mixture, as described above and in greater detail below, facilitates operating in a region where chemistry plays the dominating role in defining feature profile without relying on high bias power for high aspect ratio STI applications. The inventive etch chemistry and processes further may advantageously provide STI structure formation with low mask loss, no significant CD loss, continuous profile without asymmetry, and/or low microloading.

In some embodiments, a method for fabricating one or more shallow trench isolation (STI) structures may include providing a substrate having a patterned mask layer disposed thereon to define one or more STI structures. The substrate may be etched using a plasma formed from a process gas mixture to form one or more STI structures on the substrate, wherein the process gas mixture comprises a fluorine-containing gas and either a fluorocarbon-containing gas or a hydrofluorocarbon-containing gas.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide methods for fabricating shallow trench isolation (STI) structures that may provide at least one of reduced distortion, improved control over etch depth microloading, or mask integrity. The STI structures formed may be high aspect ratio STI structures. The inventive process may also provide flexibility in control over the STI profile, critical dimension (CD), and/or microloading to meet different requirements for different customer applications.

Figure 1:
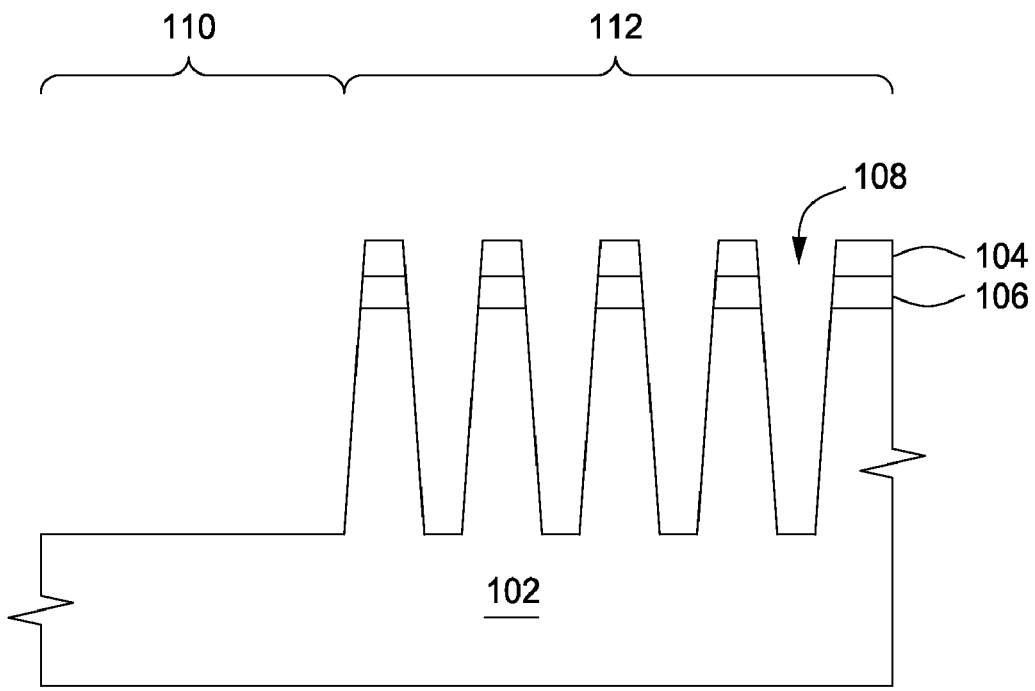
FIG. 1 is a schematic drawing of a substrate having a plurality of shallow trench isolation structures formed therein in accordance with some embodiments of the present invention.

FIG. 1 is a is a schematic drawing of a substrate 102 having a plurality of STI structures 108 formed therein in accordance with some embodiments of the present invention. The substrate may be a doped or undoped silicon substrate and may comprise additional layers (not shown). The STI structures 108 may be arranged in regions of low feature density 110 and/or in regions of high feature density 112 and may be formed by the inventive methods as described in detail hereinbelow. The STI structures 108 may be high aspect ratio structures (e.g., having aspect ratios of depth:width of at least about 3:1, or, in some embodiments between about 3:1 to about 12:1). A mask layer 104 may be formed and patterned atop the substrate 102 to define the regions where the STI structures 108 are to be etched. In some embodiments, the mask layer 104 may comprise amorphous carbon, such as Advanced Patterning Film (APF), available from Applied Materials, Inc., located in Santa Clara, Calif., or the like. In some embodiments, the mask layer 104 may be a hard mask, such as silicon nitride, silicon oxide, or the like.

Optionally, one or more layers (shown in FIG. 1 as a layer 106) may be provided between the substrate 102 and the mask layer 104. For example, intervening layers may be provided as desired for varying applications such as NAND flash, MRAM, or the like. In some embodiments, the layer 106 may comprise polysilicon.

Figure 2:
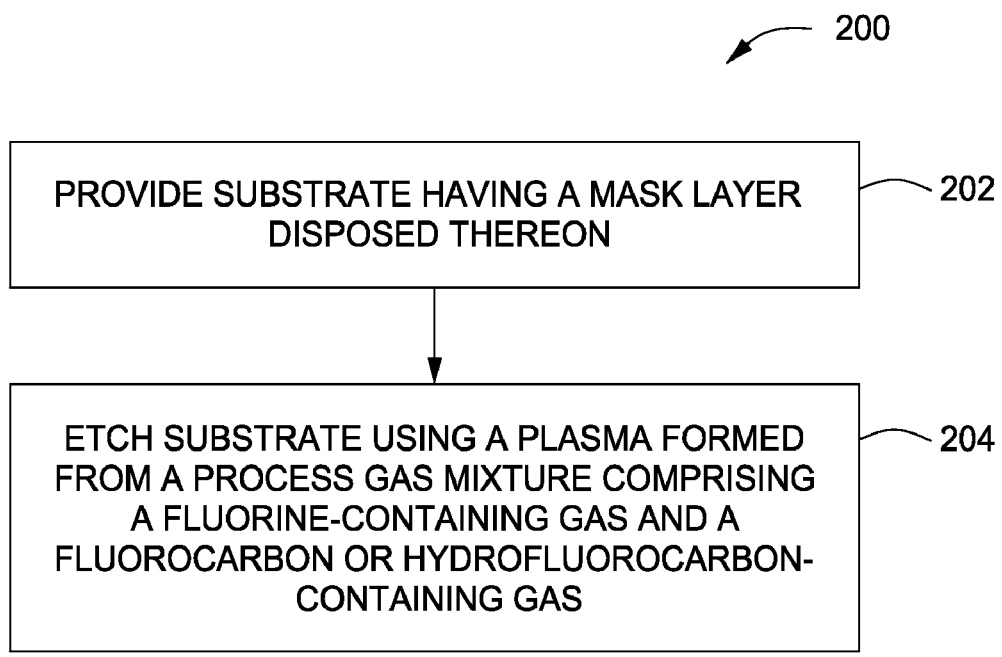
FIG. 2 is a flow diagram of a method for etching a shallow trench isolation structure in accordance with some embodiments of the present invention.

FIG. 2 is a flow diagram of a process 200 for etching an STI structure (such as STI structures 108 described above with respect to FIG. 1) in accordance with some embodiments of the present invention. The method of FIG. 2 is described with reference to FIG. 1 where appropriate. The process 200 begins at 202 where a substrate 102 having a mask layer 104 disposed thereon is provided. As discussed above, the mask layer 104 may define one or more STI structures 108 to be etched into the substrate 102. One or more intervening layers (such as layer 106) may be disposed between the mask layer 104 and the substrate 102.

Next, at 204, the substrate 102 may be etched through the mask layer 104 using a plasma formed from a process gas mixture as described below. In some embodiments, the STI structures 108 may be etched using a plasma formed from a process gas mixture comprising a fluorine-containing gas and a fluorocarbon- or hydrofluorocarbon-containing gas as the primary reactive agents. The use of a fluorine-containing gas facilitates opening up the bottom of the STI structure (e.g., alleviates the pinching off problem seen in conventional etch methods). The use of a fluorine-containing gas by itself has been observed to have low mask selectivity. The addition of a fluorocarbon- or hydrofluorocarbon-containing gas provides a passivation source that has been observed to advantageously increase the mask selectivity while at the same time not contributing to the pinching off problem. In some embodiments, the ratio of the fluorine-containing gas to the fluorocarbon- or hydrofluorocarbon-containing gas may be used advantageously to facilitate control of the etch depth microloading phenomenon, as discussed further below. Optionally, the process gas mixture may further comprise at least one of HBr, $Cl_2$, $O_2$, or an inert dilutent gas (such as $N_2$, He, Ar, or the like).

In some embodiments, the fluorine-containing gas may comprise gases that can be dissociated to form free fluorine, such as $NF_3$, $SF_6$, $CF_4$, or the like. In some embodiments, a fluorocarbon-containing gas may be provided that comprises gases that dissociate to form F radicals and $CF_x$ (where x is a positive integer), such as $CF_4$, $C_2F_6$, $C_4F_8$, or the like. In some embodiments, a hydrofluorocarbon-containing gas may be provided that comprises gases that dissociate to form F radicals and $CF_x$, as well as that provides hydrogen (H) that combines with the free fluorine in the plasma to increase the C:F ratio (or C:H:F ratio), such as $CH_2F_2$, $CH_4$, $CHF_3$, or the like. The ratio of C:F (or C:H:F) facilitates control of the properties of the plasma (although the bias power supplied also influences this behavior). For example, if the ratio of C:F is high (e.g., 1:4 or greater, such as when using $C_4F_8$), the plasma can provide more passivation source as compared to a plasma formed from a chemistry where the ratio is low (e.g., 1:2 or lower, such as when using $CF_4$). For C:H:F chemistries, the greater the C—H containing chemical bonding, the easier it is to form C—H—F polymer passivation precursor. In some embodiments, the process gas mixture comprises $NF_3$ and $CH_2F_2$.

In some embodiments, the fluorine-containing gas (such as $NF_3$) may be provided at a flow rate of between about 10 to 200 standard cubic centimeters per minute (sccm), or in some embodiments, up to about 60 sccm. In some embodiments, the fluorocarbon- or hydrofluorocarbon-containing gas (such as $CH_2F_2$) may be provided at a flow rate of between about 10 to 200 sccm, or in some embodiments, up to about 60 sccm. It is to be appreciated that the flow rates can be adjusted or varied depending on the chamber used for the particular application without exceeding the scope of the embodiments of the present invention. In some embodiments, the fluorine-containing gas and the fluorocarbon- or hydrofluorocarbon-containing gas may be provided at a flow ratio of fluorine-containing gas to fluorocarbon- or hydrofluorocarbon-containing gas of between about 1:3 to about 2:1 (e.g., from about 0.3 to 2), or in some embodiments, from about 0.85 to about 1.2, or in some embodiments between about 1 to 1.2. For example, in some embodiments, $NF_3$ and $CH_2F_2$ may be provided at a ratio of $NF_3$ to $CH_2F_2$ of between about 1:3 to about 2:1.

In some embodiments, $NF_3$ is used as the fluorine-containing gas. $NF_3$ provides a high fluorine dissociation that etches silicon well, even with low ion energies (e.g., with low bias power). The increase in $NF_3$ tends to attack polysilicon laterally, thus decreasing the critical dimension (CD). Due to the decrease in CD, the STI profile is more vertical, and reaches a greater depth. In some embodiments, $CH_2F_2$ is used as the fluorocarbon- or hydrofluorocarbon-containing gas. The $CH_2F_2$ chemistry is highly passivating due to CHxFy polymer formation, wherein x and y are positive integers. The polymer formation tends to prevent the CD loss, thereby leading to a more tapered STI profile.

In some embodiments, the etch depth microloading between the regions of high feature density 112 and the regions of low feature density 110 can be controlled by controlling the ratio of the fluorine-containing gas to the fluorocarbon- or hydrofluorocarbon-containing gas (e.g., the ratio of $NF_3$ to $CH_2F_2$). For example, in some embodiments, by varying the ratio of $NF_3$ to $CH_2F_2$, the etch depth microloading can be controlled between negative microloading (e.g., wherein the regions of low feature density are etched slower than the regions of high feature density) and positive microloading (e.g., wherein the regions of low feature density are etched faster than the regions of high feature density). In some embodiments, increasing the ratio of $NF_3$ to $CH_2F_2$ increases the etch depth microloading (e.g., moves the microloading from negative towards positive).

In some embodiments, the sidewall profile in the regions of high feature density 112 and the regions of low feature density 110 can be controlled by control of the ratio of the fluorine-containing gas to the fluorocarbon- or hydrofluorocarbon-containing gas (e.g., the ratio of $NF_3$ to $CH_2F_2$). For example, in some embodiments, decreasing the ratio of $NF_3$ to $CH_2F_2$ increases passivation in the regions of high feature density 112 and regions of low feature density 110, thereby facilitating control over the profiles of the features being etched therein (e.g., lower passivation tends to provide more vertical profiles). In some embodiments, the ratio of $NF_3$ to $CH_2F_2$ may be increased to obtain more vertical sidewall profiles (due to lower passivation) or, conversely, the ratio of $NF_3$ to $CH_2F_2$ may be decreased to obtain less vertical sidewall profiles (due to higher passivation).

In some embodiments, the sidewall profile in the regions of high feature density 112 and the regions of low feature density 110 can be controlled by controlling the total flow of $NF_3$ and $CH_2F_2$. For example, in some embodiments, decreasing the total flow of $NF_3$ and $CH_2F_2$ increases passivation in the regions of high feature density 112 and regions of low feature density 110, thereby facilitating control over the profiles of the features being etched therein (e.g., lower passivation tends to provide more vertical profiles). In some embodiments, the total flow of $NF_3$ and $CH_2F_2$ may be increased to obtain more vertical sidewall profiles (due to lower passivation) or, conversely, the total flow of $NF_3$ and $CH_2F_2$ may be decreased to obtain less vertical sidewall profiles (due to higher passivation).

Optionally, the process gas may also comprise one or more of hydrogen bromide (HBr), chlorine ($Cl_2$), or oxygen ($O_2$). In some embodiments, HBr may be provided at a flow rate of up to about 150 sccm, or in some embodiments, up to about 60 sccm, or in some embodiments, between about 30-60 sccm. In some embodiments, by controlling the amount of HBr added to the process gas mixture, the CD and microloading effects can also be controlled. For example, in some embodiments, increasing the quantity of HBr provided increases the sidewall passivation and hence increases the CD (e.g., the top CD, proximate the upper region of the STI structures 108, gets bigger, or the opening being etched gets wider). In some embodiments, increasing the quantity of HBr provided increases the etch rate of the regions of low feature density 110, thus leading to greater microloading (e.g., moving from negative towards positive). In some embodiments, microloading may be controlled in this manner to be either positive or negative, thereby advantageously providing flexibility for use in various applications where one type of microloading is preferred over the other.

In some embodiments, the total flow of the fluorine-containing gas and the fluorocarbon- or hydrofluorocarbon-containing gas (e.g., the total flow of $NF_3$ and $CH_2F_2$) may be controlled in relation to the quantity of HBr provided to further control the CD and mask selectivity. For example, in some embodiments, by lowering the total gas flow of $NF_3$ and $CH_2F_2$ with respect to the quantity of HBr provided, the CD may be increased. For example, in some embodiments, HBr may be provided at a ratio to the total gas flow of $NF_3$ and $CH_2F_2$ of up to about 1:1.

In some embodiments, $Cl_2$ may be provided at a flow rate of up to about 100 sccm, or in some embodiments, up to about 50 sccm, or in some embodiments, up to about 25 sccm, or in some embodiments, about 15 sccm. In some embodiments, by adding $Cl_2$ to the process gas mixture, the etch rate uniformity can be improved, for example, by reducing the slow center etch rate tendency. In some embodiments, by controlling the amount of $Cl_2$ added to the process gas mixture, microloading and the sidewall profile (e.g., the angle of the sidewalls of the STI structures 108 being etched) can also be controlled. For example, in some embodiments, increasing the quantity of $Cl_2$ provided increases the etch rate of the regions of low feature density 110, thus leading to greater microloading (e.g., moving from negative towards positive). In some embodiments, microloading may be controlled in this manner to be either positive or negative, thereby advantageously providing flexibility for use in various applications where one type of microloading is preferred over the other. In addition, in some embodiments, increasing the quantity of $Cl_2$ provided makes the sidewall profiles more vertical, which increases the bottom CD (e.g., the CD proximate the bottom of the STI structure 108 being etched).

In some embodiments, by controlling the amount of $Cl_2$ added to the process gas mixture, the etch rate uniformity across the substrate (e.g., the etch rate at the center, middle, and edge of the substrate) can also be controlled. For example, in some embodiments, increasing the quantity of $Cl_2$ provided increases the etch rate uniformity across the substrate. In addition, in some embodiments, in a plasma etcher configured similar to that shown in FIG. 3, increasing the quantity of $Cl_2$ provided increases the etch rate near the center of the substrate.

Using conventional $HBr/Cl_2$-based chemistries, some masks, such as carbon-based masks, may get etched and re-deposited on the substrate and within the STI structures, leading to an asymmetric shape of the STI structure. However, the etch chemistries provided in embodiments of the present invention do not redeposit the mask materials and provides a more uniform mask shape and improved profile of the STI structure. For example, etching STI structures according to embodiments of the present invention may yield more continuous STI structure profiles without double slope, bowing, pinch-off, or asymmetry. As profile bowing and asymmetry gets more significant at smaller line/space widths, the inventive chemistry disclosed herein provides flexibility for usage with the next technology node (e.g., 32 nm).

In some embodiments, $O_2$ may be provided at a flow rate of up to about 15 sccm, or in some embodiments, about 5 sccm. In some embodiments, the amount of $O_2$ added to the process gas mixture may be utilized to control microloading and the sidewall profile (e.g., the angle of the sidewalls of the STI structures 108 being etched). For example, in some embodiments, increasing the quantity of $O_2$ provided increases the relative etch rate of the regions of low feature density 110, thus leading to greater microloading (e.g., moving from negative towards positive). In addition, in some embodiments, increasing the quantity of $O_2$ provided makes the sidewall profiles more vertical, which increases the bottom CD (e.g., the CD proximate the bottom of the STI structure 108 being etched).

Optionally, a dilutent gas may be provided with the process gas mixture. The dilutent gas may be any inert gas, such as nitrogen ($N_2$), helium (He), Argon (Ar), or the like. The dilutent gas may be provided at a flow rate of up to about 300 sccm. In some embodiments, the dilutent gas may be provided at a flow rate of between about 100 to 300 sccm.

The process gas mixture may be formed into a plasma by coupling RF power at a suitable frequency to the process gas mixture within a process chamber under suitable conditions to establish and maintain the plasma, such as described below with respect to FIG. 3. For example, in some embodiments, a plasma power source of up to about 3000 W, or between about 500-1500 W, or about 1000 W, at a frequency in a range from 50 kHz to 13.56 MHz may be provided to an inductively coupled antenna of the process chamber to ignite and maintain the plasma. In some embodiments, up to about 500 W, or between about 20-100 W, or about 70 W, of a bias power may be provided, for example, at a frequency of about 13.56 MHz to the substrate via a substrate support. The chamber may be maintained at a pressure of between about 6-60 mT and at a temperature of between about 20-70 degrees Celsius, or about 50 degrees Celsius.

For example, in some embodiments, the process gas may comprise $NF_3$, $CH_2F_2$, $Cl_2$, and HBr provided at respective flow rates of about 60, 60, 15, and 30 sccm; a plasma power source of about 1000 W, at a frequency of about 13.56 MHz may be provided to an inductively coupled antenna of the process chamber to ignite and maintain the plasma; about 70 W of a bias power may be provided at a frequency of about 13.56 MHz to the substrate via a substrate support; and the chamber may be maintained at a pressure of about 20 mT and at a temperature of about 50 degrees Celsius.

The processes described herein may be performed in an integrated etch processing system (e.g., a cluster tool) that includes a vacuum transfer chamber having processing chambers coupled thereto that are suitable for etching materials present in the substrate, such as silicon and, optionally, metal, polysilicon, and high-k material layers present in, for example, a gate film stack. The processes described herein may also be preformed in other integrated etch processing systems.

Figure 3:
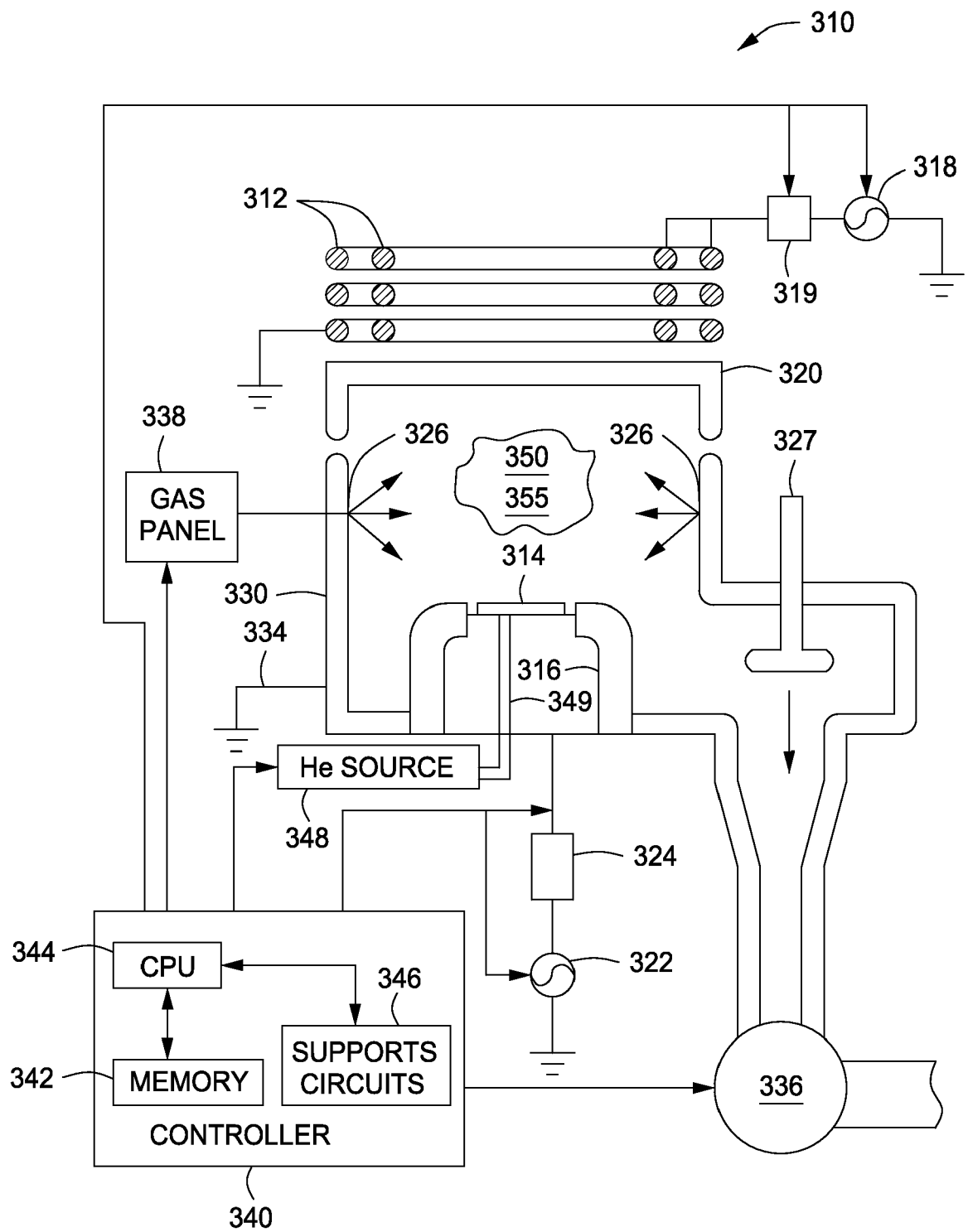
FIG. 3 depicts an etch reactor suitable for performing portions of the present invention.
Figure 4A:
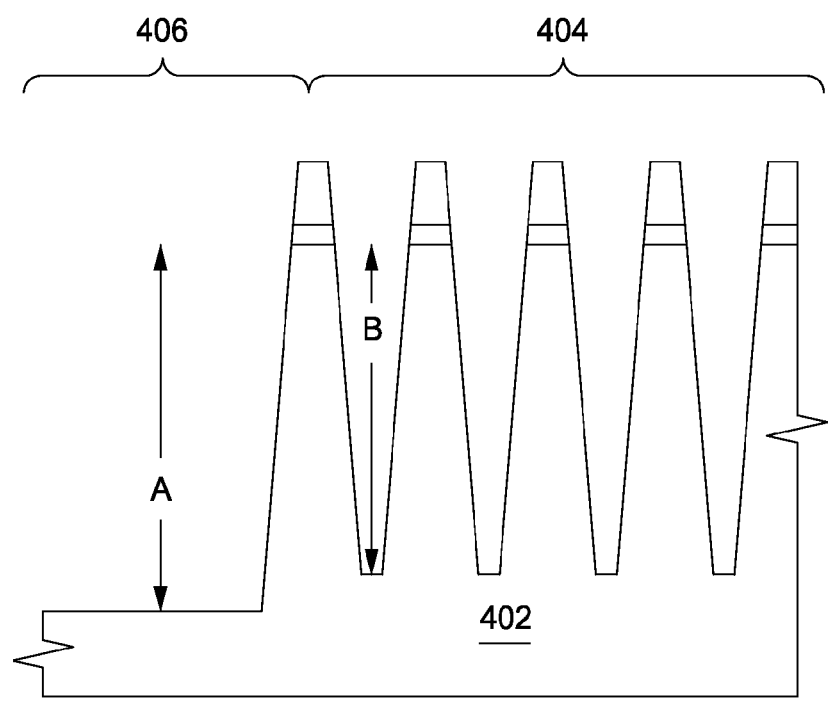
FIGS. 4A-D respectively depict schematic drawings of substrate having a plurality of shallow trench isolation structures formed therein and illustrating various defects that may occur in the formation of such shallow trench isolation structures.
Figure 4B:
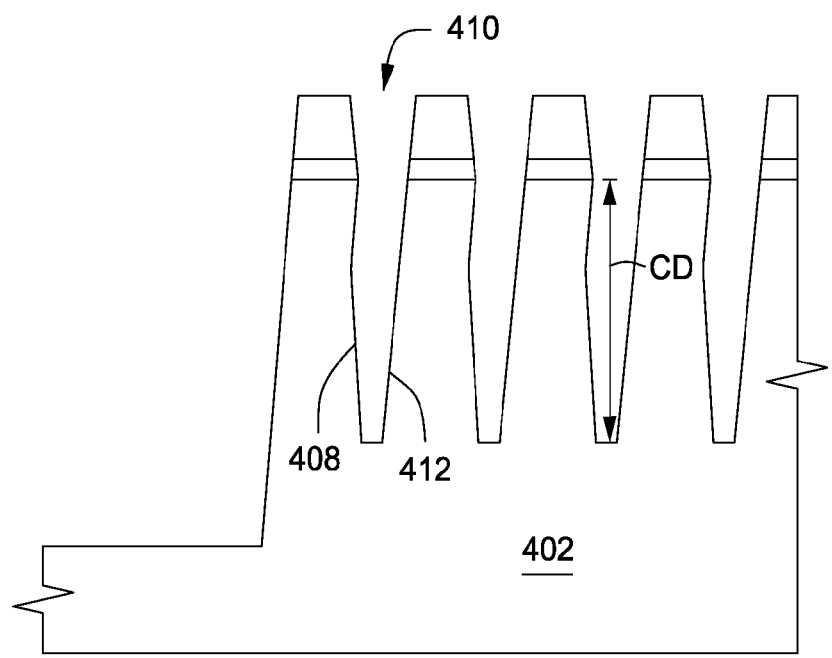
Figure 4C:
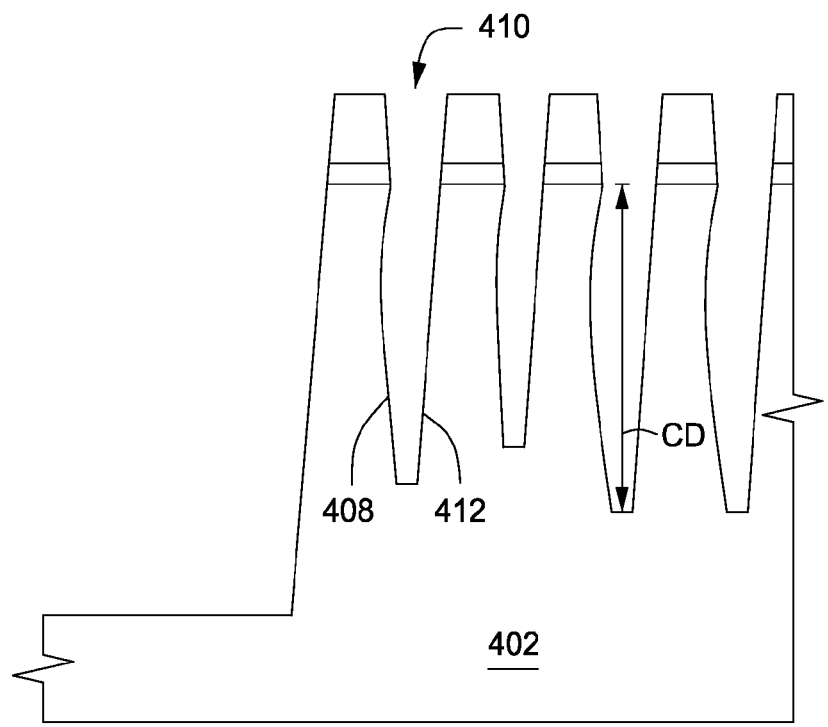
Figure 4D:
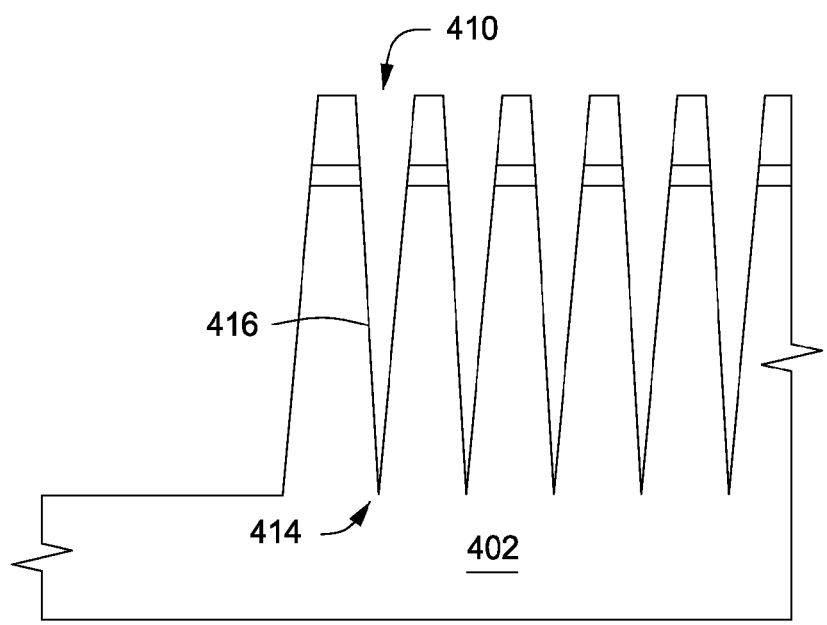

For example, FIG. 3 depicts a schematic diagram of an illustrative etch reactor 300 of the kind that may be used to practice embodiments of the invention as discussed herein. The etch reactor 300 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 300 include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well.

The etch reactor 300 comprises a chamber 310 having a substrate support (cathode) 316 within a conductive body (wall) 330, and a controller 340. The chamber 310 may be supplied with a substantially flat dielectric ceiling 320. Alternatively, the chamber 310 may have other types of ceilings, e.g., a dome-shaped ceiling. An antenna comprising at least one inductive coil element 312 is disposed above the ceiling 320 (two co-axial inductive coil elements 312 are shown). The inductive coil element 312 is coupled to a plasma power source 318 through a first matching network 319. The plasma power source 318 typically is capable of producing up to 3000 W at a tunable frequency in a range from 50 kHz to 13.56 MHz.

The substrate support 316 is coupled, through a second matching network 324, to a biasing power source 322. The biasing power source 322 generally is capable of producing up to 1500 W at a frequency of approximately 13.56 MHz. The biasing power may be either continuous or pulsed power. In other embodiments, the biasing power source 322 may be a DC or pulsed DC source.

A controller 340 comprises a central processing unit (CPU) 344, a memory 342, and support circuits 346 for the CPU 344 and facilitates control of the components of the chamber 310 and, as such, of the etch process, as discussed below in further detail.

In operation, a substrate 314 is placed on the substrate support 316 and process gases are supplied from a gas panel 338 through entry ports 326 and form a gaseous mixture 350. The gaseous mixture 350 is ignited into a plasma 355 in the chamber 310 by applying power from the plasma power source 318 and biasing power source 322 to the inductive coil element 312 and the cathode 316, respectively. The pressure within the interior of the chamber 310 is controlled using a throttle valve 327 and a vacuum pump 336. Typically, the wall 330 is coupled to an electrical ground 334. The temperature of the wall 330 is controlled using liquid-containing conduits (not shown) that run through the wall 330.

The temperature of the substrate 314 is controlled by stabilizing a temperature of the substrate support 316. In one embodiment, the helium gas from a gas source 348 is provided via a gas conduit 349 to channels (not shown) formed in the pedestal surface under the substrate 314. The helium gas is used to facilitate heat transfer between the substrate support 316 and the substrate 314. During processing, the substrate support 316 may be heated by a resistive heater (not shown) within the pedestal to a steady state temperature and then the helium gas facilitates uniform heating of the substrate 314. Using such thermal control, the substrate 314 may be maintained at a temperature of between about 0-350 degrees Celsius.

Other etch chambers may be used to practice the invention, including chambers with remote plasma sources, electron cyclotron resonance (ECR) plasma chambers, and the like.

To facilitate control of the process chamber 310 as described above, the controller 340 may be one of any form of general-purpose computer processor that can be used in an industrial setting for controlling various chambers and subprocessors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method described herein is generally stored in the memory 342 as a software routine. The software routine may also be stored and/or executed by a second CPU (not shown) that is remotely located from the hardware being controlled by the CPU 344.

The invention may be practiced using other semiconductor substrate processing systems wherein the processing parameters may be adjusted to achieve acceptable characteristics by those skilled in the art by utilizing the teachings disclosed herein without departing from the spirit of the invention.

Thus, shallow trench isolation (STI) structures and methods of fabrication have been provided herein. Balancing of the chemistry mixture, as described above, facilitates operating in a region where chemistry plays the dominating role in defining feature profile without relying on high bias power for high aspect ratio STI applications. The inventive etch chemistry and processes further may advantageously provide STI structure formation with low mask loss, no significant CD loss, continuous profile without asymmetry, and/or low microloading.

While the foregoing is directed to embodiments of the present invention, other and further embodiments of the invention may be devised without departing from the basic scope thereof.

The invention claimed is:

1. A method for fabricating a plurality of shallow trench isolation (STI) structures, comprising:
   providing a substrate having a patterned mask layer disposed thereon to define a plurality of STI structures grouped into a first region having a first density of one or more first STI structures and a second region having a second density of one or more second STI structures, wherein the second density is greater than the first density;
   etching the substrate using a plasma formed from a process gas mixture to form the plurality of STI structures on the substrate, wherein the process gas mixture comprises a fluorine-containing gas and either a fluorocarbon-containing gas or a hydrofluorocarbon-containing gas; and
   controlling a ratio of the etch rate of the first STI structures in the first region to the etch rate of the second STI structures in the second region by adjusting a gas flow rate ratio of the fluorine-containing gas to the fluorocarbon-containing gas or the hydrofluorocarbon-containing gas.

2. The method of claim 1, further comprising:
   increasing the etch rate of the first STI structures in the first region by increasing the gas flow rate ratio of the fluorine-containing gas to the fluorocarbon-containing gas or the hydrofluorocarbon-containing gas.

3. The method of claim 1, further comprising:
   etching each of the first and second STI structures to a substantially equivalent depth.

4. The method of claim 1, wherein the mask layer comprises carbon.

5. The method of claim 1, wherein an aspect ratio of a depth to width of the plurality of STI structures is at least about 3:1.

6. The method of claim 1, wherein an aspect ratio of a depth to width of the plurality of STI structures is between about 3:1 to about 12:1.

7. The method of claim 1, wherein the substrate further comprises:
   one or more intervening layers disposed between the substrate and the mask layer.

8. The method of claim 1, wherein the substrate further comprises one or more intervening layers, wherein at least one layer of the one or more intervening layers comprises polysilicon.

9. The method of claim 1, wherein a gas flow rate ratio of the fluorine-containing gas to the fluorocarbon-containing gas or the hydrofluorocarbon-containing gas is between about 1:1 to about 2:1.

10. The method of claim 1, wherein the fluorine-containing gas comprises at least one of nitrogen trifluoride ($NF_3$), sulfur hexafluoride ($SF_6$), or carbon tetrafluoride ($CF_4$).

11. The method of claim 1, wherein the fluorocarbon-containing gas comprises at least one of carbon tetrafluoride ($CF_4$), hexafluoroethane ($C_2F_6$), or octafluorocyclobutane ($C_4F_8$).

12. The method of claim 1, wherein the hydrofluorocarbon-containing gas comprises at least one of difluoromethane ($CH_2F_2$), carbon tetrafluoride ($CF_4$), or trifluoromethane ($CHF_3$).

13. The method of claim 1, further comprising:
    controlling a sidewall profile of the plurality of STI structures by adjusting a gas flow rate ratio of the fluorine-containing gas to the fluorocarbon-containing gas or the hydrofluorocarbon-containing gas.

14. The method of claim 1, further comprising:
    controlling a sidewall profile of the plurality of STI structures by adjusting the total flow rate of the fluorine-containing gas and the fluorocarbon-containing gas or the hydrofluorocarbon-containing gas.

15. The method of claim 1, wherein the process gas mixture further comprises an inert gas, wherein the inert gas comprises at least one of nitrogen ($N_2$), helium (He), or argon (Ar).

16. The method of claim 15, wherein the inert gas is provided at a flow rate of up to about 300 sccm.

17. The method of claim 1, wherein the process gas mixture further comprises nitrogen trifluoride ($NF_3$) and difluoromethane ($CH_2F_2$).

18. The method of claim 17, wherein a gas flow rate ratio of $NF_3$ to $CH_2F_2$ is between about 1:3 to about 2:1.

19. The method of claim 1, wherein the process gas mixture further comprises at least one of hydrogen bromide (HBr), chlorine ($Cl_2$), or oxygen ($O_2$).

20. The method of claim 19, wherein hydrogen bromide is provided at a flow rate of up to about 150 sccm.

21. The method of claim 19, wherein a gas flow rate ratio of hydrogen bromide to the fluorine-containing gas and the fluorocarbon-containing gas or the hydrofluorocarbon-containing gas is up to about 1:1.

22. The method of claim 19, wherein chlorine is provided at a flow rate of up to about 100 sccm.

23. The method of claim 19, wherein oxygen is provided at a flow rate ratio of up to about 15 sccm.

* * * * *